United States Patent
Lou

(10) Patent No.: US 9,285,630 B2
(45) Date of Patent: Mar. 15, 2016

(54) TRANSPARENT DISPLAY

(71) Applicant: Shanghai Tianma Micro-Electronics Co., Ltd., Shanghai (CN)

(72) Inventor: Junhui Lou, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 14/085,761

(22) Filed: Nov. 20, 2013

(65) Prior Publication Data

US 2014/0078451 A1    Mar. 20, 2014

Related U.S. Application Data

(63) Continuation of application No. PCT/CN2012/085841, filed on Dec. 4, 2012.

(30) Foreign Application Priority Data

Jul. 24, 2012   (CN) .......................... 201210258402.2

(51) Int. Cl.
*G02F 1/1335*    (2006.01)
*G02F 1/13363*   (2006.01)
*H01L 51/52*     (2006.01)

(52) U.S. Cl.
CPC .... *G02F 1/133528* (2013.01); *G02F 1/133512* (2013.01); *H01L 51/5281* (2013.01); *G02F 1/13363* (2013.01); *G02F 1/133514* (2013.01); *G02F 2201/44* (2013.01); *G02F 2203/01* (2013.01); *G02F 2203/62* (2013.01); *H01L 51/5234* (2013.01); *H01L 2251/5323* (2013.01)

(58) Field of Classification Search
CPC .......... G02F 2201/44; G02F 1/133528; G02F 1/13363; G02F 2203/01; H01L 51/5234; H01L 51/5281; H01L 2251/5323; G09G 3/30; G09G 2300/046
USPC ................. 349/96, 98, 117, 119; 359/489.07; 313/504; 345/54
See application file for complete search history.

(56) References Cited

U.S. PATENT DOCUMENTS

| 5,448,386 | A  | * | 9/1995 | Watanabe et al. ............. 349/119 |
| 8,253,153 | B2 |   | 8/2012 | Shanks |
| 2005/0062693 | A1 |   | 3/2005 | Suzuki |
| 2012/0327331 | A1 | * | 12/2012 | Yim et al. ........................ 349/62 |

FOREIGN PATENT DOCUMENTS

| CN | 1602127 A | 3/2005 |
| CN | 2682768 Y | 3/2005 |
| CN | 1949530 A | 4/2007 |
| CN | 1967358 A | 5/2007 |
| CN | 101025482 A | 8/2007 |
| CN | 102217025 A | 10/2011 |
| JP | 2003178865 A | 6/2003 |

* cited by examiner

*Primary Examiner* — Dung Nguyen
*Assistant Examiner* — Tai Duong
(74) *Attorney, Agent, or Firm* — Alston & Bird LLP

(57) ABSTRACT

A transparent display is disclosed. The display includes a self-emitting display unit, a first polarizing unit arranged on a viewing side of the self-emitting display unit, a liquid crystal module, and a second polarizing unit. The liquid crystal module and the second polarizing unit are arranged on a backlight side of the self-emitting display unit. In addition, the liquid crystal module is configured to adjust a display contrast of the self-emitting display unit.

7 Claims, 3 Drawing Sheets

TRANSPARENT DISPLAY

CROSS-REFERENCES TO RELATED APPLICATIONS

This application claims priority to and is a continuation of PCT/CN2012/085841, filed on Dec. 4, 2012, and entitled "TRANSPARENT DISPLAY", which claims the benefit of Chinese Patent Application No. 201210258402.2, filed with the Chinese Patent Office on Jul. 24, 2012 and entitled "TRANSPARENT DISPLAY", the contents of which are incorporated herein by reference in their entirety.

FIELD

The present application relates to the field of displays and particularly to transparent displays.

BACKGROUND OF THE INVENTION

An Organic Light-Emitting Diode (OLED) plays a vital role in the field of next-generation flat display applications due to its advantages of self-emitting, no need of a backlight source, a high display contrast, a low thickness, a wide angle of view, a high response speed and availability to a flexible panel, etc.

Numerous transparent displays in the prior art generally adopt OLEDs as their self-emitting display units because an OLED transparent display has a higher transmissivity and a better display brightness as compared with a Liquid Crystal Display (LCD) transparent display, where the LCD transparent display has a transmissivity of only 15%, and the OLED transparent display has a transmissivity of up to 40%.

The OLED transparent display incapable of blocking background light might have a poor display contrast and fail to effectively present a black state when the background light is intensive, thus degrading both the display contrast and a user experience of the transparent display. However, those skilled in the art aiming at an improved OLED display would rather pay attention to the transparency thereof while disregarding an improved display contrast thereof.

BRIEF SUMMARY OF THE INVENTION

One inventive aspect is a transparent display. The display includes a self-emitting display unit, a first polarizing unit arranged on a viewing side of the self-emitting display unit, a liquid crystal module, and a second polarizing unit. The liquid crystal module and the second polarizing unit are arranged on a backlight side of the self-emitting display unit. In addition, the liquid crystal module is configured to adjust a display contrast of the self-emitting display unit.

BRIEF DESCRIPTION OF THE DRAWINGS

In order to make the technical solution of the embodiments of the present application, the drawings to be used in a description of the embodiments will be briefly introduced below. Apparently, the drawings to be described below are merely illustrative of some embodiments of the present application, and those ordinarily skilled in the art can derive, from these drawings, other embodiments without any inventive effort.

DETAILED DESCRIPTION OF THE INVENTION

The technical solution in the embodiments of the present application will be described below clearly and fully with reference to the drawings in the embodiments. Apparently the described embodiments are merely a part but not all of the embodiments of the present application. Based on the embodiments of the present application here, all of other embodiments derived by those ordinarily skilled in the art without any inventive effort shall come into the scope of the present application.

Figure 1:
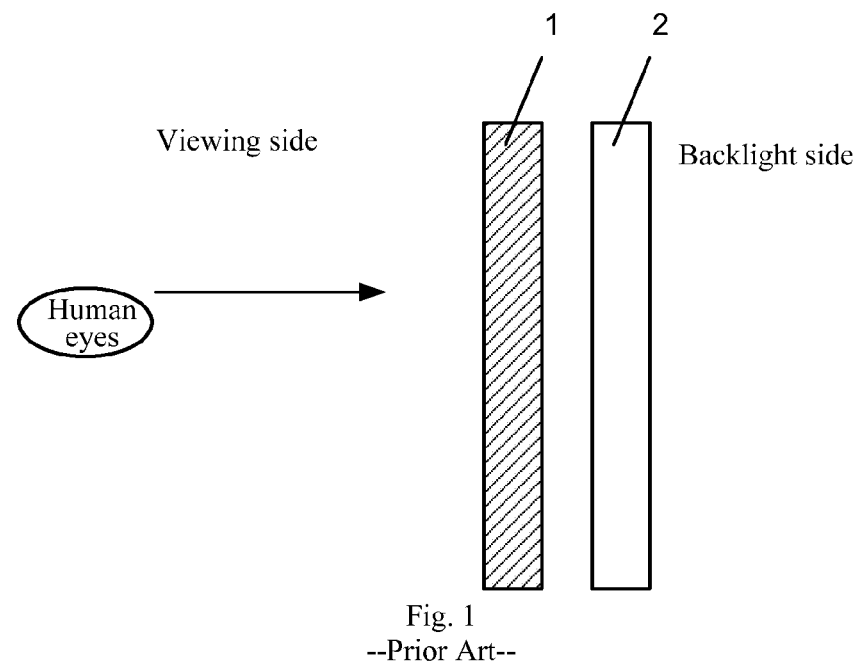
FIG. 1 is a schematic structural diagram of an existing transparent display.

Embodiments of the present application will be described below with reference to the drawings. Reference is made to FIG. 1 illustrating a schematic structural diagram of a transparent display in the prior art, where the transparent display includes a first polarizing unit 1 and a self-emitting display unit 2. The first polarizing unit 1 is generally configured to prevent the transparent display from reflecting ambient light to improve the display contrast of the transparent display.

However, even if the additional first polarizing unit 1 can improve the display contrast of the liquid crystal display, background light may still pass through the self-emitting display unit 2 because the self-emitting display unit 2 is a transparent material. Consequently, the display contrast of the transparent display illustrated in FIG. 1 is improved insignificantly, and the improved display contrast may still be low.

Figure 2:
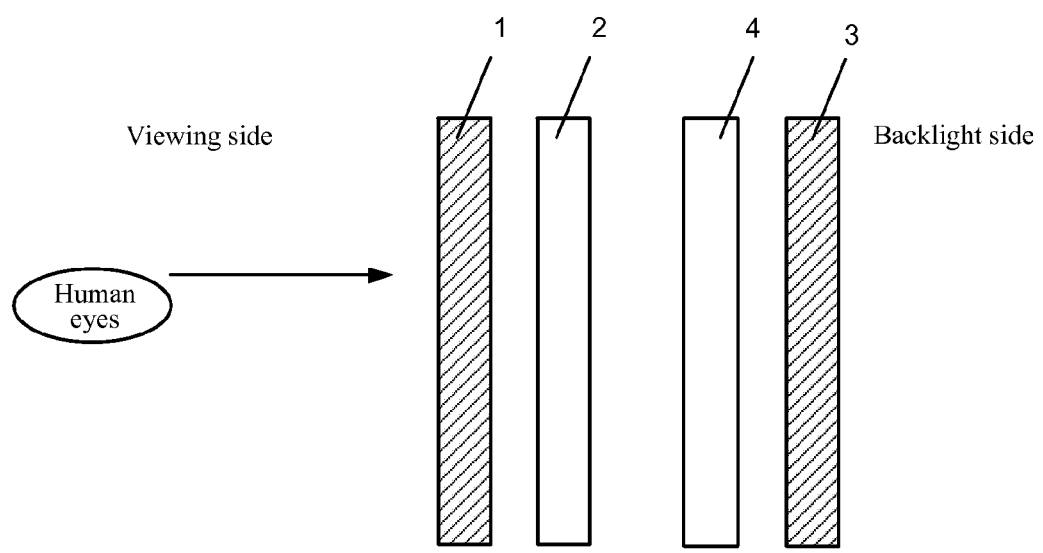
FIG. 2 is a schematic structural diagram of a transparent display according to a first embodiment of the present application.

Reference is made to FIG. 2 illustrating a schematic structural diagram of a transparent display according to a first embodiment of the present application, where the transparent display includes a self-emitting display unit 2, a first polarizing unit 1 used in cooperation with the self-emitting display unit 2, a liquid crystal module 4, and a second polarizing unit 3 used in cooperation with the first polarizing unit 1. The liquid crystal module 4 is configured to adjust a display contrast of the self-emitting display unit 2. In other words, the liquid crystal module 4 acts as an optical valve to choose to shield or un-shield background light dependent upon the intensity of ambient light, thereby enabling the transparent display to present a better black state and providing a user with a better view experience. In an implementation, the background light becomes polarized light through the second polarizing unit 3, and the polarized light passes through the liquid crystal module 4, where whether to have the polarized light deflected is determined by the state of the liquid crystal module 4, to consequently determine whether to have the polarized light pass through the first polarizing unit 1.

In an implementation, the first polarizing unit 1 includes a first linearly polarizing unit, and the second polarizing unit 3 includes a second linearly polarizing unit, where the second linearly polarizing unit is arranged on a rear surface of the liquid crystal module 4.

The surface of the liquid crystal module 4 facing with the self-emitting display unit 2 is the front surface, and the other surface thereof is the rear surface.

Figure 3:
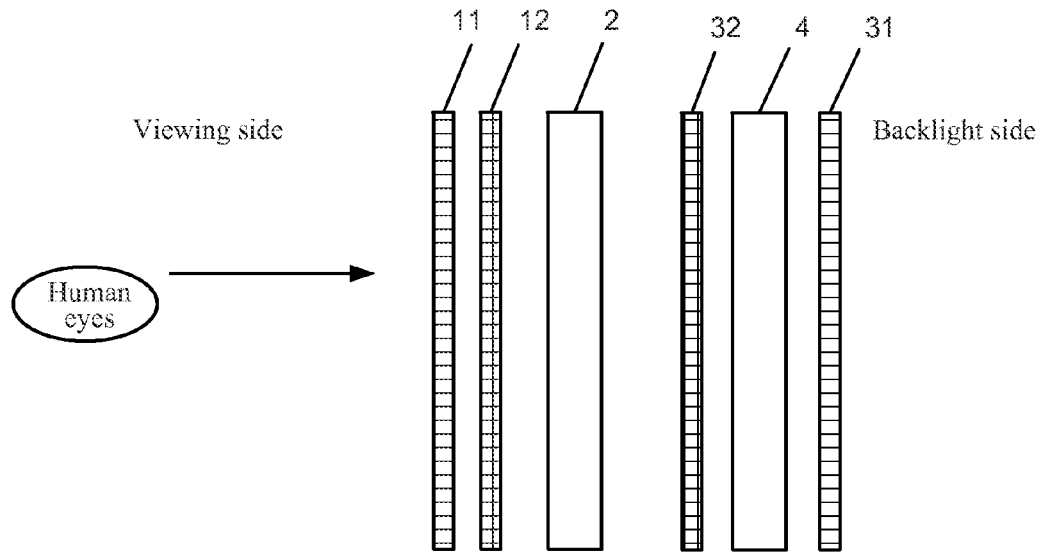
FIG. 3 is a schematic structural diagram of a transparent display according to a second embodiment of the present application.

In a preferred implementation, as illustrated in FIG. 3, the first polarizing unit includes the first linearly polarizing unit 11 and a one-quarter wavelength compensating film 12, and the second polarizing unit includes the second linearly polarizing unit 31 and a three-quarter wavelength compensating film 32, where the one-quarter wavelength compensating film 12 is configured to compensate a resulting phase difference of light passing through the first polarizing unit to recover circularly polarized light. The three-quarter wavelength compensating film 32 is arranged between the self-emitting display unit 2 and the liquid crystal module 4, and the three-quarter wavelength compensating film 32 is used in cooperation with the one-quarter wavelength compensating film 12 to compensate an optical delay resulting from the one-quarter wavelength compensating film 12.

In an implementation, the first polarizing unit 1 and the second polarizing unit 3 are arranged parallelly:

When a specific area or pixel of the transparent display needs to present a black state, the self-emitting display unit 2 corresponding to the area or the pixel is in a non-emitting state, and the liquid crystal module 4 is in a state where polarized light passing therethrough is deflected. Background light becomes polarized light after passing through the second polarizing unit 3 and is deflected after passing through the liquid crystal module 4 and consequently cannot pass through the first polarizing unit 1. Thus background light cannot pass through the transparent display, and the area (or the pixel) of the transparent display can present a good black state even if background light is bright.

When a specific area or pixel of the transparent display needs to present a white state, the self-emitting display unit 2 corresponding to the area or the pixel is in an emitting state, and the liquid crystal module 4 is in a state where polarized light passing therethrough is not deflected.

When a specific area or pixel of the transparent display needs to present a transparent state, the self-emitting display unit 2 corresponding to the area or the pixel is in a non-emitting state, and the liquid crystal module 4 is in a state where polarized light passing therethrough is not deflected. Thus the area or the pixel will not emit, but background light can pass through the transparent display. Then the area or the pixel can present a transparent state.

In another implementation, the first polarizing unit 1 and the second polarizing unit 3 are arranged vertically:

When the transparent display needs to present a black state, the self-emitting display unit 2 is in a non-emitting state, and the liquid crystal module 4 is in a state where polarized light passing therethrough is not deflected;

When the transparent display needs to present a white state, the self-emitting display unit 2 is in an emitting state, and the liquid crystal module 4 is in a state where polarized light passing therethrough is deflected; and When the transparent display needs to present a transparent state, the self-emitting display unit 2 is in a non-emitting state, and the liquid crystal module 4 is in a state where polarized light passing therethrough is deflected.

When the first polarizing unit 1 and the second polarizing unit 3 are arranged parallelly, the self-emitting display unit 2 and the liquid crystal module 4 are less frequently put into an ON state, thereby lowering power consumption, therefore, the first implementation is preferred over the second implementation.

Referring to FIG. 3, the first polarizing unit 1 includes the one-quarter wavelength compensating film 12 and the first linearly polarizing unit 11, and the second polarizing unit 3 includes the second linearly polarizing unit 31 and the three-quarter wavelength compensating film 32. The first polarizing unit and the second polarizing unit are arranged vertically or parallelly as mentioned above refers to the first linearly polarizing unit 11 and the second linearly polarizing unit 31 are arranged vertically or parallelly. Background light becomes polarized light after passing through the second linearly polarizing unit 31, where whether to have the polarized light deflected is determined by the state of the liquid crystal module 4, and then becomes elliptically polarized light after passing through the three-quarter wavelength compensating film 32, where the elliptically polarized light is turned back into linearly polarized light after passing through the self-emitting display unit 2 and then passing through the one-quarter wavelength compensating film 12, and may (or may not) pass through the first linearly polarizing unit 11.

It shall be noted that in the foregoing embodiments, the liquid crystal module 4 includes a Twisted Nematic-Liquid Crystal (TN-LC) display module or a Super Twisted Nematic-Liquid Crystal (STN-LC) display module and a Thin Film Transistor-Liquid Crystal (TFT-LC) display module.

The self-emitting display unit includes an OLED.

The transparent display disclosed in the present application and the transparent displays in the prior art are compared with reference to the table below:

| Display | Transmissivity | Brightness | Display Contrast |
|---|---|---|---|
| Transparent self-emitting display without circularly polarizing plate | 30-40% | Very high | Very low |
| Transparent self-emitting display with circularly polarizing plate | 14-19% | High | Low |
| Transparent liquid crystal display without backlight module | 7-15% | Low | High |
| Transparent display in the present application | 12-17% | High | Very high |

As can be apparent from the table above, the transparent display in the present application has a higher display contrast as compared with the transparent self-emitting displays in the prior art and has a higher brightness and a better transmissivity as compared with the transparent liquid crystal display in the prior art.

It shall be noted that the added circularly polarizing unit and the liquid crystal module have little influence on the transmissivity of the display:

1. The transmissivity of the two combined circularly polarizing plates is approximate to that of the single circularly polarizing plate in the case of having polarized light pass through.

2. A Thin Film Transistor (TFT) area of the liquid crystal module typically is smaller than a TFT area of the OLED of the self-emitting display, and the liquid crystal module can be arranged in a non-transparent area of the OLED of the self-emitting display after calibration to lower the influence on the transmissivity of the self-emitting display.

In the embodiment of the present application, the second polarizing unit that consists of the second linearly polarizing unit and the three-quarter wavelength compensating film is equivalent to a circularly polarized unit.

Figure 4:
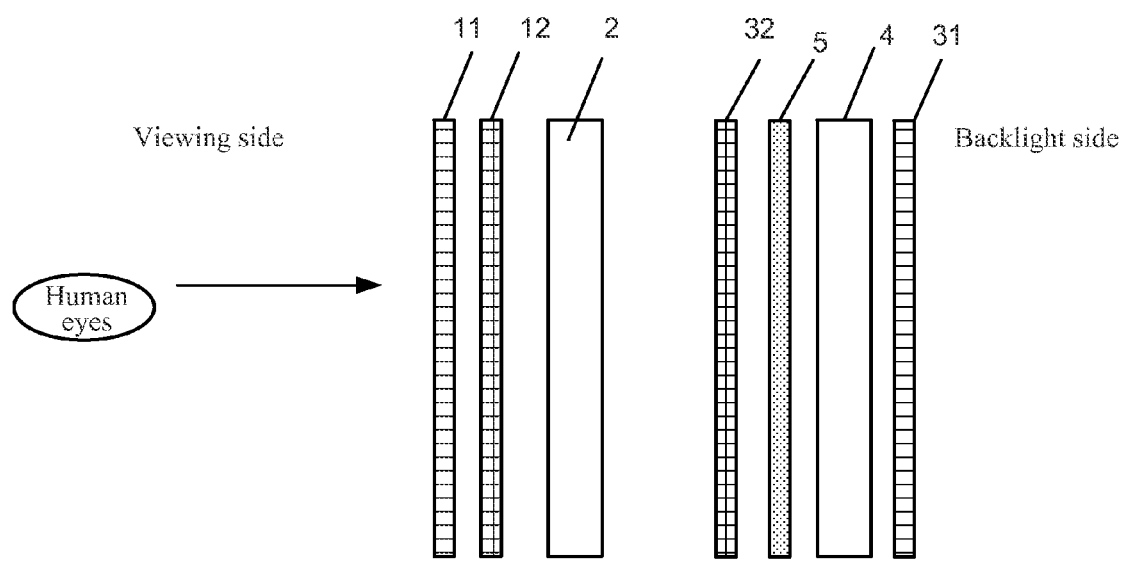
FIG. 4 is a schematic structural diagram of a transparent display according to a third embodiment of the present application.
Figure 5:
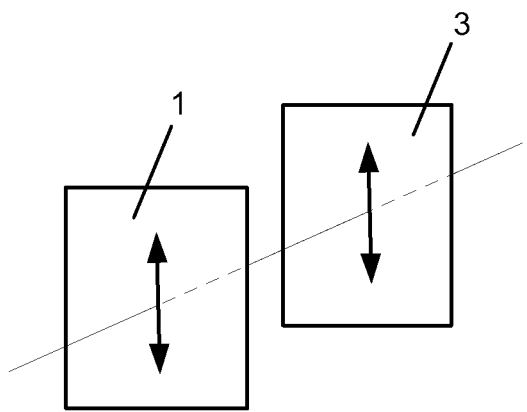
FIG. 5 illustrates an axis of a first polarizing unit and an axis of a second polarizing unit in parallel.
Figure 6:
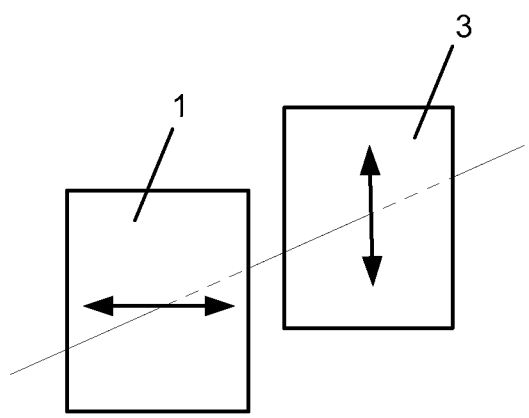
FIG. 6 illustrates an axis of a first polarizing unit and an axis of a second polarizing unit arranged vertically.

Reference is made to FIG. 4 illustrating a schematic structural diagram of a cross section of a transparent display according to a third embodiment of the present application, where the transparent display includes the first linearly polarizing unit 11, the one-quarter wavelength compensating film 12, the self-emitting display unit 2, the second linearly polarizing unit 31, the three-quarter wavelength compensating film 32, the liquid crystal module 4 and a color filter unit 5. In an implementation, the color filter unit 5 is arranged between the liquid crystal module 4 and the three-quarter wavelength compensating film 32. The state of the liquid crystal module 4 is controlled to have background light in different colors pass through the display.

In an implementation, the components of the transparent display are the first linearly polarizing unit 11, the one-quarter wavelength compensating film 12, the self-emitting display unit 2, the three-quarter wavelength compensating film 32, the color filter unit 5, the liquid crystal module 4 and the second linearly polarizing unit 31 in that order from the viewing side.

It shall be noted that the foregoing order in which the components of the transparent display are arranged is merely illustrative but not intended to limit the present application.

It shall be further noted that the components of the transparent display in the embodiments of the present application may not necessarily be arranged separately as illustrated in the drawings, but such an illustration is merely for the purpose of making the disclosure of the present application more intuitive, and in fact, it is more practical to arrange the components in tight contact with each other.

The embodiments of the present application have the following advantages or advantageous effects:

The problem disregarded by those skilled in the art that the existing transparent display has a low display contrast is identified, and the combination of the self-emitting display unit and the liquid crystal module can maintain the advantages of a high transmissivity and a high brightness of the existing transparent display and overcome the drawback of the existing transparent display failing to effectively present a black state, thus improving a user experience.

The foregoing embodiments of the apparatus are merely illustrative, and the units described as separate components may or may not be physically separate, while the components illustrated as units may or may not be physical units, that is, they can be co-located or can be distributed onto a plurality of network elements. A part or all of the modules therein can be selected as required in practice to achieve the object of the solution of the embodiments. Those ordinarily skilled in the art can appreciate and implement the solution of the embodiments without any inventive effort.

Evidently those skilled in the art can make various modifications and variations to the invention without departing from the scope of the invention. Thus the invention is also intended to encompass these modifications and variations thereto so long as the modifications and variations come into the scope of the claims appended to the invention and their equivalents.

What is claimed is:

1. A transparent display, comprising:
    a self-emitting display unit,
    a first polarizing unit arranged on a viewing side of the self-emitting display unit,
    a liquid crystal module, and
    a second polarizing unit,
    wherein the liquid crystal module and the second polarizing unit are arranged on a backlight side of the self-emitting display unit, and wherein the liquid crystal module is configured to adjust a display contrast of the self-emitting display unit,
    wherein the first polarizing unit comprises a first linearly polarizing unit and a one-quarter wavelength compensating film located between the first linearly polarizing unit and the self-emitting display unit,
    wherein the second polarizing unit comprises a second linearly polarizing unit and a three-quarter wavelength compensating film,
    wherein the second linearly polarizing unit is located on a side of the liquid crystal module away from the self-emitting display unit, and
    wherein the three-quarter wavelength compensating film is located between the self-emitting display unit and the liquid crystal module and is configured to compensate an optical delay resulting from the one-quarter wavelength compensating film;
    wherein the transparent display comprises a color filter unit located between the three-quarter wavelength compensating film and the liquid crystal module.

2. The transparent display according to claim 1, wherein a polarization axis of the first polarizing unit and a polarization axis of the second polarizing unit are parallel,
    wherein when the transparent display presents a white state or a transparent state, the liquid crystal module does not deflect polarized light passing therethrough, and wherein when the transparent display presents a black state, the liquid crystal module deflects polarized light passing therethrough.

3. The transparent display according to claim 1, wherein a polarization axis of the first polarizing unit and a polarization axis of the second polarizing unit are vertical,
    wherein when the transparent display presents a white state or a transparent state, the liquid crystal module deflects polarized light passing therethrough, and wherein when the transparent display presents a black state, the liquid crystal module does not deflect polarized light passing therethrough.

4. The transparent display according to claim 1, wherein the liquid crystal module comprises a twisted nematic-liquid crystal display module or a super twisted nematic-liquid crystal display module and a thin film transistor-liquid crystal display module.

5. The transparent display according to claim 4, wherein the self-emitting display unit comprises an organic light-emitting diode.

6. The transparent display according to claim 1, wherein a polarization axis of the first polarizing unit and the a polarization axis of the second polarizing unit are parallel, wherein when a portion of the transparent display presents a white state or a transparent state, a portion of the liquid crystal module corresponding to the portion of the transparent display does not deflect polarized light passing therethrough, and wherein when the portion of the transparent display presents a black state, the portion of the liquid crystal module corresponding to the portion of the transparent display deflects polarized light passing therethrough.

7. The transparent display according to claim 1, wherein the three-quarter wavelength compensating film is used to transform a linearly polarized light into an elliptically polarized light, and the one-quarter wavelength compensating film is used to transform the elliptically polarized light into a linearly polarized light.

* * * * *